US012660623B2

(12) United States Patent
Sano

(10) Patent No.: US 12,660,623 B2
(45) Date of Patent: Jun. 16, 2026

(54) SEMICONDUCTOR DEVICE AND METHOD OF MANUFACTURING SEMICONDUCTOR DEVICE

(71) Applicant: Kioxia Corporation, Tokyo (JP)

(72) Inventor: Yuichi Sano, Tokyo (JP)

(73) Assignee: KIOXIA CORPORATION, Tokyo (JP)

( * ) Notice: Subject to any disclaimer, the term of this patent is extended or adjusted under 35 U.S.C. 154(b) by 543 days.

(21) Appl. No.: 18/177,962

(22) Filed: Mar. 3, 2023

(65) Prior Publication Data

US 2023/0411239 A1      Dec. 21, 2023

(30) Foreign Application Priority Data

Jun. 15, 2022    (JP) ................................. 2022-096612

(51) Int. Cl.
*H01L 23/34* (2006.01)
*H10B 80/00* (2023.01)
(Continued)

(52) U.S. Cl.
CPC .......... *H10W 40/258* (2026.01); *H10B 80/00* (2023.02); *H10W 70/02* (2026.01);
(Continued)

(58) Field of Classification Search
CPC ............. H01L 23/3736; H01L 21/4871; H01L 23/3142; H01L 24/08; H01L 24/32;
(Continued)

(56) References Cited

U.S. PATENT DOCUMENTS 8,941,246 B2    1/2015  Miura et al.
10,276,544 B2    4/2019  Matsumoto et al.
(Continued)

FOREIGN PATENT DOCUMENTS

JP      2001-102495 A      4/2001
JP      2019-054181 A      4/2019
(Continued)

*Primary Examiner* — Theresa T Doan
(74) *Attorney, Agent, or Firm* — Foley & Lardner LLP

(57) ABSTRACT

A semiconductor device includes a wiring board, a first semiconductor chip provided on the wiring board upwards, the first semiconductor chip including a first front surface having a connection terminal electrically connected to the wiring board and a second front surface opposite the first front surface, a chip stacked body provided on the wiring board upwards, the chip stacked body including a second semiconductor chip, a sealing insulator configured to cover the first semiconductor chip and the chip stacked body, the sealing insulator containing a resin, and a heat conductor provided between the sealing insulator and the second front surface and including a first region extending in a first direction which is an in-plane direction of the wiring board and a second region extending in a second direction from an end of the first region on a side of the first direction when a direction perpendicular to the in-plane direction of the wiring board and the first direction is defined as the second direction, the heat conductor having heat conductivity higher than heat conductivity of the resin.

17 Claims, 15 Drawing Sheets

A3-A4

(51) Int. Cl.
    *H10W 40/25*     (2026.01)
    *H10W 70/02*     (2026.01)
    *H10W 74/10*     (2026.01)
    *H10W 90/00*     (2026.01)
    *H10W 74/00*     (2026.01)
    *H10W 80/00*     (2026.01)

(52) U.S. Cl.
    CPC ......... *H10W 74/127* (2026.01); *H10W 90/00* (2026.01); *H10W 74/00* (2026.01); *H10W 80/701* (2026.01); *H10W 90/732* (2026.01); *H10W 90/736* (2026.01); *H10W 90/752* (2026.01); *H10W 90/754* (2026.01); *H10W 90/794* (2026.01)

(58) Field of Classification Search
    CPC ................... H01L 25/165; H01L 24/48; H01L 2224/08123; H01L 2224/08225; H01L 2224/32145; H01L 2224/32245; H01L 2224/48145; H01L 2224/48227; H01L 2924/182; H01L 23/49816; H01L 2225/06506; H01L 2225/0651; H01L 2225/06562; H01L 2225/06575; H01L 2225/06586; H01L 23/4334; H01L 23/3675; H01L 25/0657; H01L 25/18; H01L 2225/06517; H01L 2225/06589; H10B 80/00
    USPC ........................................................ 257/712
    See application file for complete search history.

(56) References Cited

U.S. PATENT DOCUMENTS

2011/0192381 A1* 8/2011 Maruyama ............. F02M 37/08
    123/497
2015/0262975 A1 9/2015 Kawato
2018/0374773 A1 12/2018 Kurosawa
2019/0131203 A1 5/2019 Kang et al.
2021/0134693 A1 5/2021 Matsumoto
2021/0398912 A1* 12/2021 Park ................... H01L 23/5286

FOREIGN PATENT DOCUMENTS

TW     201917840 A     5/2019
TW     202119566 A     5/2021

* cited by examiner

```
        ┌──────────────────────────────────┐
        │              START               │
        └──────────────────────────────────┘
                        │
                        ▼
        ┌──────────────────────────────────┐
        │  FORM SEMICONDUCTOR CHIP 3        │── S1
        └──────────────────────────────────┘
                        │
                        ▼
        ┌──────────────────────────────────┐
        │     FORM HEAT CONDUCTOR 4         │── S2
        └──────────────────────────────────┘
                        │
                        ▼
        ┌──────────────────────────────────┐
        │   FORM CHIP STACKED BODY 2        │── S3
        └──────────────────────────────────┘
                        │
                        ▼
        ┌──────────────────────────────────┐
        │  FORM SEALING INSULATOR 5         │── S4
        └──────────────────────────────────┘
                        │
                        ▼
        ┌──────────────────────────────────┐
        │        FORM EXTERNAL             │── S5
        │   CONNECTION TERMINAL 11          │
        └──────────────────────────────────┘
                        │
                        ▼
        ┌──────────────────────────────────┐
        │             GRINDE                │── S6
        └──────────────────────────────────┘
                        │
                        ▼
        ┌──────────────────────────────────┐
        │           SINGULATE               │── S7
        └──────────────────────────────────┘
                        │
                        ▼
        ┌──────────────────────────────────┐
        │              END                 │
        └──────────────────────────────────┘
```

*FIG. 18*

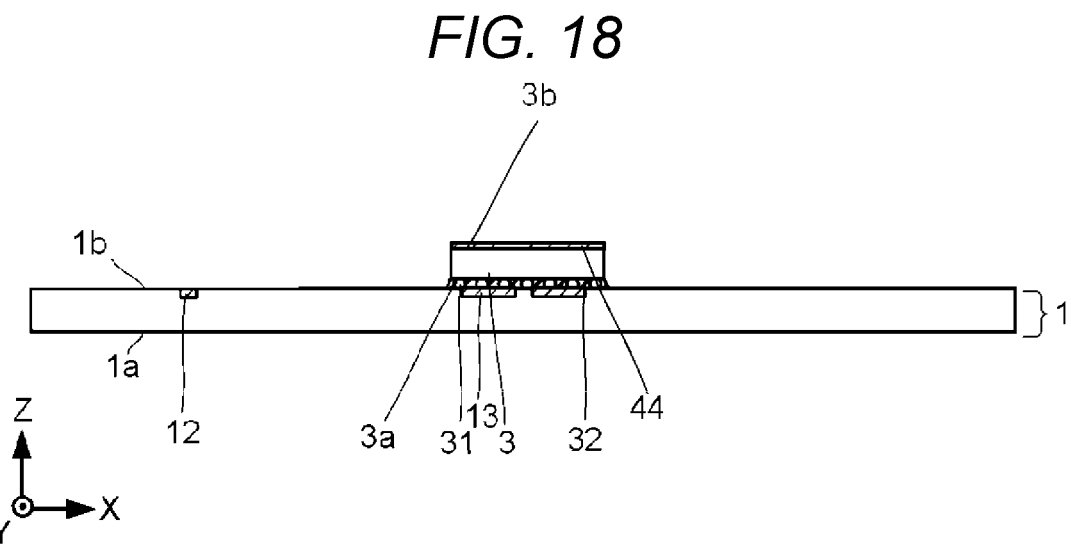

SEMICONDUCTOR DEVICE AND METHOD OF MANUFACTURING SEMICONDUCTOR DEVICE

CROSS-REFERENCE TO RELATED APPLICATION(S)

This application is based upon and claims the benefit of priority from Japanese Patent Application No. 2022-096612, filed Jun. 15, 2022, the entire contents of which are incorporated herein by reference.

FIELD

Embodiments described herein relate generally to a semiconductor device.

BACKGROUND

A semiconductor device such as a NAND flash memory includes a plurality of semiconductor chips stacked on a wiring board.

DESCRIPTION OF THE DRAWINGS

FIG. 4 is a schematic diagram illustrating the first structural example of the semiconductor device.

FIG. 17 is a flowchart showing an example of a method of manufacturing the semiconductor device.

FIG. 18 is a schematic diagram illustrating a formation step S1 of a semiconductor chip.

DETAILED DESCRIPTION

Figure 1:
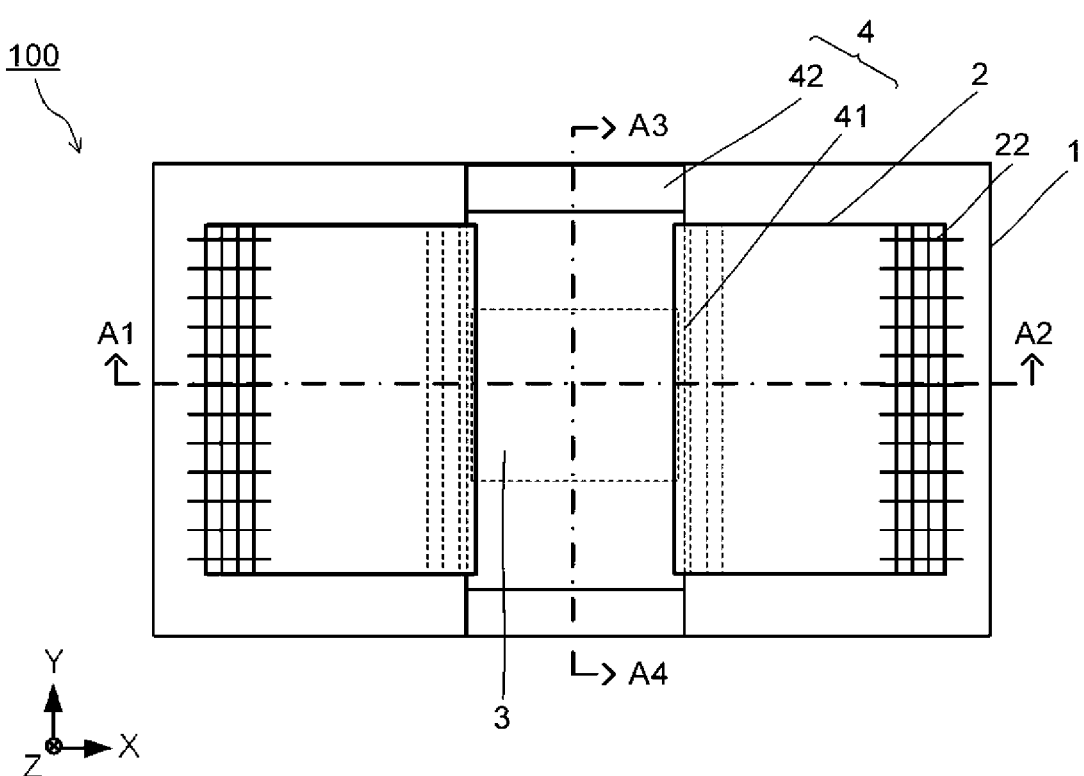
FIG. 1 is a schematic diagram illustrating a first structural example of a semiconductor device.

Embodiments provide a semiconductor device having high reliability.

In general, according to at least one embodiment, a semiconductor device includes a wiring board, a first semiconductor chip provided on the wiring board upwards, the first semiconductor chip including a first front surface having a connection terminal electrically connected to the wiring board and a second front surface opposite the first front surface, a chip stacked body provided on the wiring board upwards, the chip stacked body including a second semiconductor chip, a sealing insulator configured to cover the first semiconductor chip and the chip stacked body, the sealing insulator containing a resin, and a heat conductor provided between the sealing insulator and the second front surface and including a first region extending in a first direction which is an in-plane direction of the wiring board and a second region extending in a second direction from an end of the first region on a side of the first direction when a direction perpendicular to the in-plane direction of the wiring board and the first direction is defined as the second direction, the heat conductor having heat conductivity higher than heat conductivity of the resin.

Hereinafter, embodiments will be described with reference to the drawings. The relationship between the thickness and the plane dimension of each component, the ratio of the thickness of each component, and the like illustrated in the drawings may be different from the actual product. Further, in the embodiments, substantially the same components will be denoted by the same reference numerals or symbols, and descriptions thereof will be omitted as appropriate.

Unless otherwise specified, the term "connection" in this specification includes not only physical connection but also electrical or thermal connection.

First Embodiment

Figure 2:
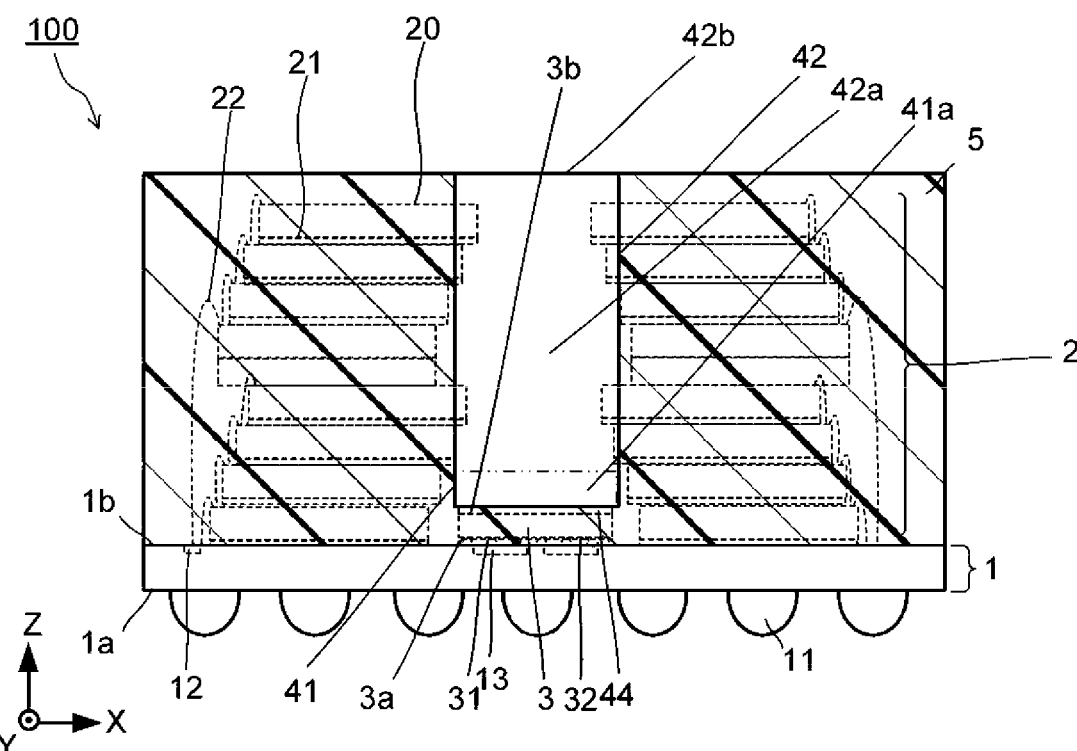
FIG. 2 is a schematic diagram illustrating the first structural example of the semiconductor device.
Figure 3:
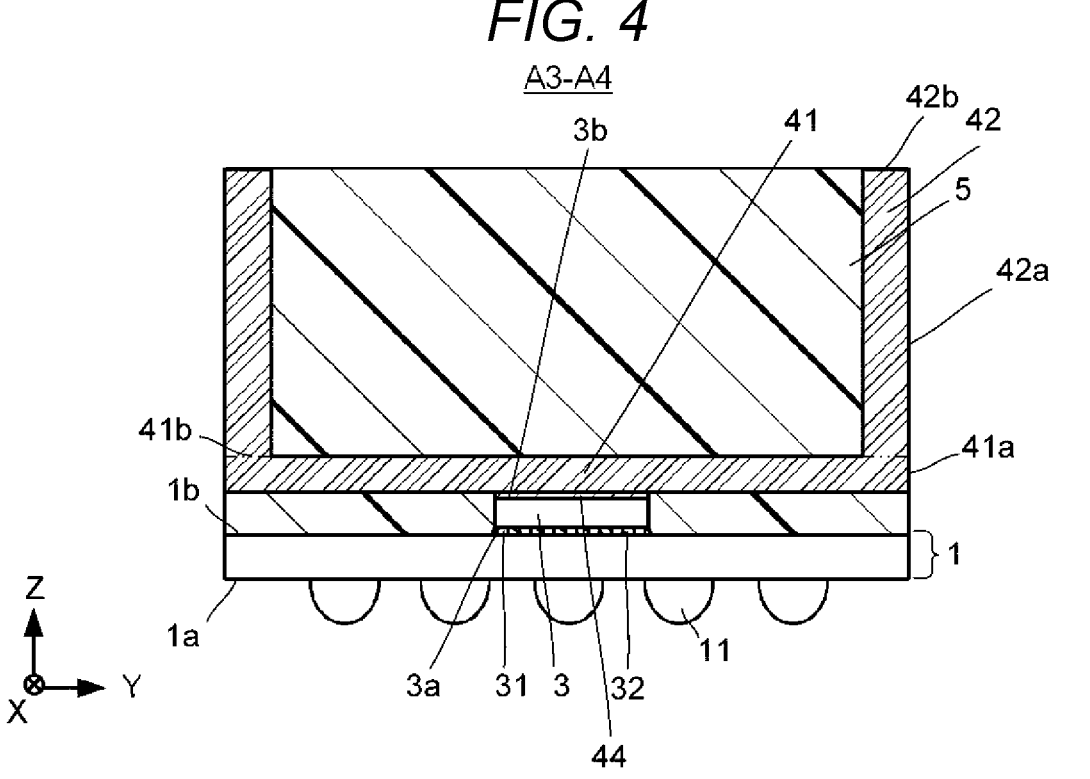
FIG. 3 is a schematic diagram illustrating the first structural example of the semiconductor device.

FIGS. 1 to 4 are schematic diagrams illustrating a first structural example of a semiconductor device. FIGS. 1 to 4 show an X-axis, a Y-axis perpendicular to the X-axis, and a Z-axis perpendicular to the X-axis and the Y-axis. Here, the X-axis is, for example, a direction parallel to a front surface 1b of a wiring board 1, the Y-axis is a direction parallel to the front surface 1b and perpendicular to the X-axis, and the Z-axis is a direction perpendicular to the front surface 1b. FIG. 1 illustrates an example of an upper surface of the semiconductor device viewed from the Z-axis direction. FIG. 1 does not illustrate some components, or illustrates the same with dotted lines for convenience. FIG. 2 illustrates an example of the side surface of the semiconductor device viewed from the Y-axis direction. FIG. 3 illustrates an example of the X-Z cross section taken along line segment A1-A2 in FIG. 1. FIG. 4 illustrates an example of the Y-Z cross section taken along line segment A3-A4 in FIG. 1.

A semiconductor device 100 includes a wiring board 1, a chip stacked body 2, a semiconductor chip 3, a heat conductor 4, and a sealing insulator 5.

The wiring board 1 includes a plurality of external connection terminals 11 provided on a front surface 1a, a plurality of conductive pads 12 provided on the front surface 1b opposite the front surface 1a, and a plurality of conductive pads 13. An example of the wiring board 1 includes a printed wiring board (PWB).

The external connection terminals 11 are formed using, for example, gold, copper, solder, or the like. The external connection terminals 11 may be formed using, for example, tin-silver-based or tin-silver-copper-based lead-free solder. Further, the external connection terminals 11 may be formed by stacking a plurality of metal materials. It is noted that FIG. 1 illustrates the external connection terminals 11 formed using conductive balls.

The conductive pads 12 and the conductive pads 13 are connected to the external connection terminals 11 with the internal wiring of the wiring board 1 interposed therebetween. The conductive pads 12 and the conductive pads 13 contain a metal element such as copper, gold, palladium, or nickel. For example, the conductive pads 12 and the conductive pads 13 may be formed by forming a plated film containing the above-described materials by an electrolytic plating method, a non-electrolytic plating method, or the like.

The chip stacked body 2 is provided on the front surface 1b of the wiring board 1 upwards. The chip stacked body 2 includes a plurality of semiconductor chips 20. An example of the semiconductor chip 20 includes a memory chip. A nonvolatile memory chip or a volatile memory chip may be used as the memory chip. A NAND memory chip, a phase change memory chip, a resistance change memory chip, a ferroelectric memory chip, a magnetic memory chip, or the like may be used as the nonvolatile memory chip. A dynamic random access memory (DRAM) chip or the like may be used as the volatile memory chip.

The plurality of semiconductor chips 20 are sequentially stacked with adhesive layers 21 respectively interposed therebetween on the front surface 1b of the wiring board 1 upwards. An example of the adhesive layer 21 includes a die attach film (DAF). FIGS. 1 to 4 illustrate a first chip stacked body including four semiconductor chips 20 stacked on the front surface 1b to form steps, a second chip stacked body including four semiconductor chips 20 stacked on the first chip stacked body to form steps, a third chip stacked body including four semiconductor chips 20 stacked on the front surface 1b to form steps, and a fourth chip stacked body including four semiconductor chips 20 stacked on the third chip stacked body to form steps. In other words, the plurality of semiconductor chips 20 stacked to form steps partially overlap each other. Further, the number of the semiconductor chips 20 and the stacked structure thereof are not limited to the number thereof and the stacked structure illustrated in FIGS. 1 to 4.

The plurality of semiconductor chips 20 respectively have a plurality of connection pads (not illustrated) on the front surface. Each connection pad is connected to each conductive pad 12 via a corresponding bonding wire 22. The bonding wire 22 contains metal elements such as gold, silver, copper, and palladium. For example, one of the plurality of semiconductor chips 20 and the other one are bonded to each other with the adhesive layer 21 interposed therebetween. The semiconductor chip 20 located at the lowest stage may be bonded to the front surface 1b or a spacer with the adhesive layer 21 interposed therebetween. The adhesive layers 21 respectively located under the semiconductor chips 20 respectively located at the lowest stages of the second chip stacked body and the fourth chip stacked body are thicker than the other adhesive layers 21, and the bonding wires 22 respectively connected to the semiconductor chips 20 respectively located at the uppermost stages of the first chip stacked body and the third chip stacked body are partially embedded in the above-mentioned thick adhesive layers 21, respectively. For convenience, FIG. 2 illustrates the semiconductor chip 20, the adhesive layer 21, and the bonding wire 22 by dotted lines.

The semiconductor chip 3 is provided on the front surface 1b of the wiring board 1 upwards. The first structural example of the semiconductor device shows an example in which a plurality of chip stacked bodies 2 are provided around the semiconductor chip 3 on the front surface 1b. The semiconductor chip 3 is bonded to the conductive pad 13 of the wiring board 1 by flip-chip bonding. The semiconductor chip 3 includes a front surface 3a having a connection terminal 31 and a front surface 3b opposite the front surface 3a. The connection terminal 31 is electrically connected to the conductive pad 13 of the wiring board 1.

The connection terminal 31 is formed using, for example, gold, copper, solder, or the like. The connection terminal 31 may be formed using, for example, tin-silver-based or tin-silver-copper-based lead-free solder. Further, the connection terminal 31 may be formed by stacking a plurality of metal materials. In FIGS. 1 to 4, although the connection terminal 31 is formed using a conductive ball, the connection terminal 31 may be formed using a bump.

An example of the semiconductor chip 3 includes a memory controller chip. The semiconductor chip 3 is mounted on the front surface 1b of the wiring board 1 and electrically connected to the semiconductor chip 20 through the internal wiring of the wiring board 1. The semiconductor chip 3 is provided on the front surface 1b with an underfill resin 32 interposed therebetween. An example of the underfill resin 32 is an epoxy-based thermosetting resin. When the semiconductor chip 20 is a memory chip and the semiconductor chip 3 is a memory controller chip, the semiconductor chip 3 performs control operations such as writing data to the semiconductor chip 20 and reading data therefrom.

The heat conductor 4 has a lower plate 41 (first region) and a side plate 42 (second region). The heat conductor 4 is bonded to the front surface 3b of the semiconductor chip 3 with an adhesive layer 44 interposed therebetween. An example of the adhesive layer 44 includes a DAF. The heat conductor 4 is provided apart from the chip stacked body 2. Preferably, only the sealing insulator 5 exists between the heat conductor 4 and the chip stacked body 2, but the present disclosure is not limited thereto. When viewed from the Y-axis direction, the side plate 42 of the heat conductor 4 and the chip stacked body 2 may partially overlap each other.

FIG. 4 illustrates an interface between the region of the lower plate 41 and the region of the side plate 42 with a two-dot chain line.

The lower plate 41 is an approximately flat plate extending in the Y-axis direction, is provided between the sealing insulator 5 and the front surface 3*b*, and has a lower surface in contact with the adhesive layer 44. An end surface (side surface) 41*a* of the lower plate 41 in the Y-axis direction (direction in one direction which is in-plane direction of wiring board 1) is exposed from the sealing insulator 5. The side plate 42 is a flat plate extending in the Z-axis direction from an end surface (upper end surface) 41*b* facing the Z-axis direction at each of the opposite ends of the lower plate 41 in the Y-axis direction. That is, the side plate 42 extends in the direction (Z-axis direction) perpendicular to the in-plane direction of the wiring board 1 and the Y-axis direction of the lower plate 41. Therefore, two side plates 42 are present. Here, the side plate 42 may extend only from the end surface 41*b* at one end of the lower plate 41 in the Y-axis direction. In this case, only one side plate 42 is present. The side plate 42 has an end surface (side surface) 42*a* facing the Y-axis direction and an end surface (upper surface) 42*b* facing the Z-axis direction, the end surface 42*a* and the end surface 42*b* being exposed from the sealing insulator 5. The side plate 42 may be in contact with a heat sink (not illustrated) at the upper end in the Z-axis direction. The end surface 41*a* of the lower plate 41 facing the Y-axis direction may not be exposed from the sealing insulator 5. The end surface 42*a* of the side plate 42 in the Y-axis direction may not be exposed from the sealing insulator 5. The end surface 42*b* of the side plate 42 in the Z-axis direction may not be exposed from the sealing insulator 5. The heat sink may be formed over the sealing insulator 5. The upper surface of the sealing insulator 5 and the end surface 42*b* of the side plate 42 may be substantially flush with each other. The side surface of the sealing insulator 5 and the end surface 42*a* of the side plate 42 may be substantially flush with each other.

The heat conductor 4 has heat conductivity higher than heat conductivity of a resin contained in the sealing insulator 5. The heat conductor 4 has heat conductivity higher than heat conductivity of the sealing insulator 5. The heat conductor 4 is formed using a material containing metal such as copper. The heat conductor 4 may be formed, for example, by preparing a member made of the above-mentioned material that is processed into a desired shape in advance and bonding the member to the front surface 3*b* of the semiconductor chip 3 with the adhesive layer 44 interposed therebetween.

The heat conductor 4 may have an oxide front surface in contact with the sealing insulator 5 or an uneven front surface in contact with the sealing insulator. Accordingly, the adhesion between the heat conductor 4 and the sealing insulator 5 can be enhanced.

The sealing insulator 5 covers the chip stacked body 2 and the semiconductor chip 3, and seals the chip stacked body 2 and the semiconductor chip 3. The sealing insulator 5 contains an inorganic filler such as silicon oxide ($SiO_2$) and a resin such as an epoxy thermosetting resin. Further, for example, the sealing insulator 5 is formed by a molding method such as a transfer molding method, a compression molding method, or an injection molding method using a sealing resin obtained by mixing an inorganic filler with an organic resin. FIG. 1 omits illustration of the sealing insulator 5 for the sake of convenience.

The semiconductor device 100 may have a conductive shield on the front surface of the sealing insulator 5. The conductive shield covers, for example, at least a part of the side surface of the wiring board 1 and the sealing insulator 5. Additionally, the conductive shield may cover the heat conductor 4. The conductive shield may be formed, for example, by forming a film by sputtering or the like. The conductive shield is preferably formed of a metal layer having low electrical resistivity in order to prevent leakage of unnecessary electromagnetic waves emitted from the semiconductor chip 20 in the sealing insulator 5 and the internal wiring of the wiring board 1. For example, a metal layer formed of copper, SUS, nickel, or the like is applied to the conductive shield. A thickness of the conductive shield is preferably set based on its electrical resistivity. Further, the conductive shield may be connected to the wiring connected to the external connection terminal 11 such as a ground terminal by exposing a part of the via in the wiring board 1 and bringing the same into contact with the conductive shield.

Figure 5:
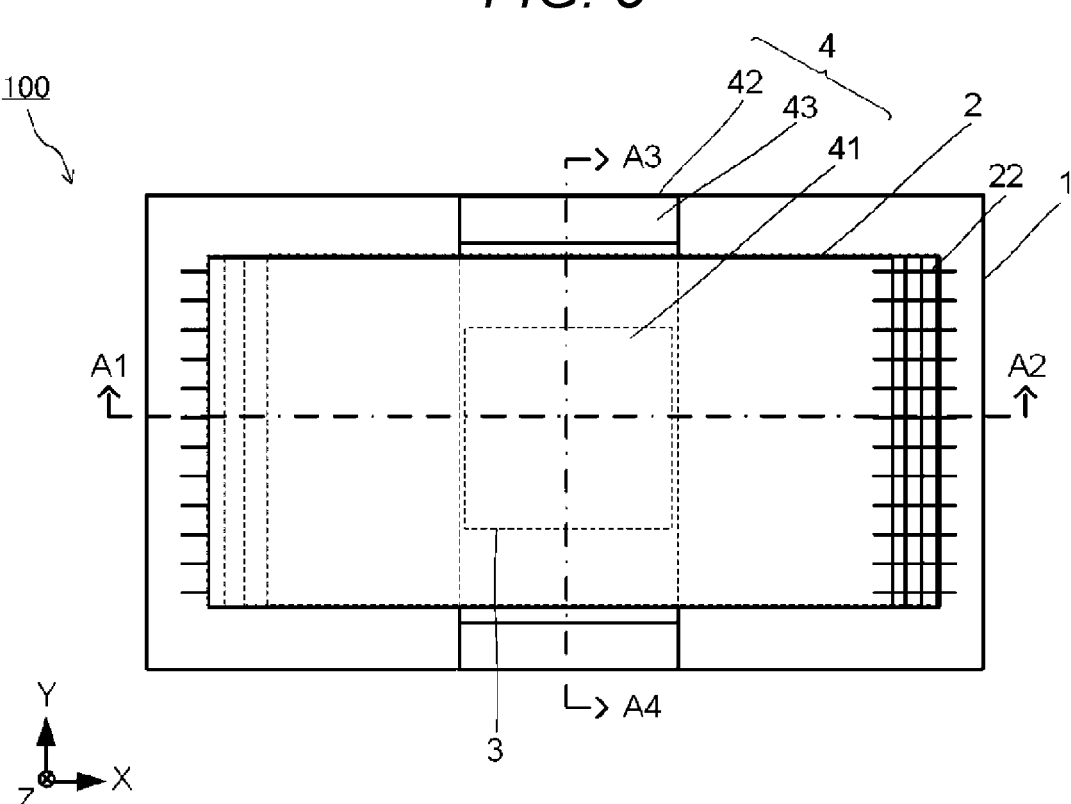
FIG. 5 is a schematic diagram illustrating a second structural example of the semiconductor device.
Figure 6:
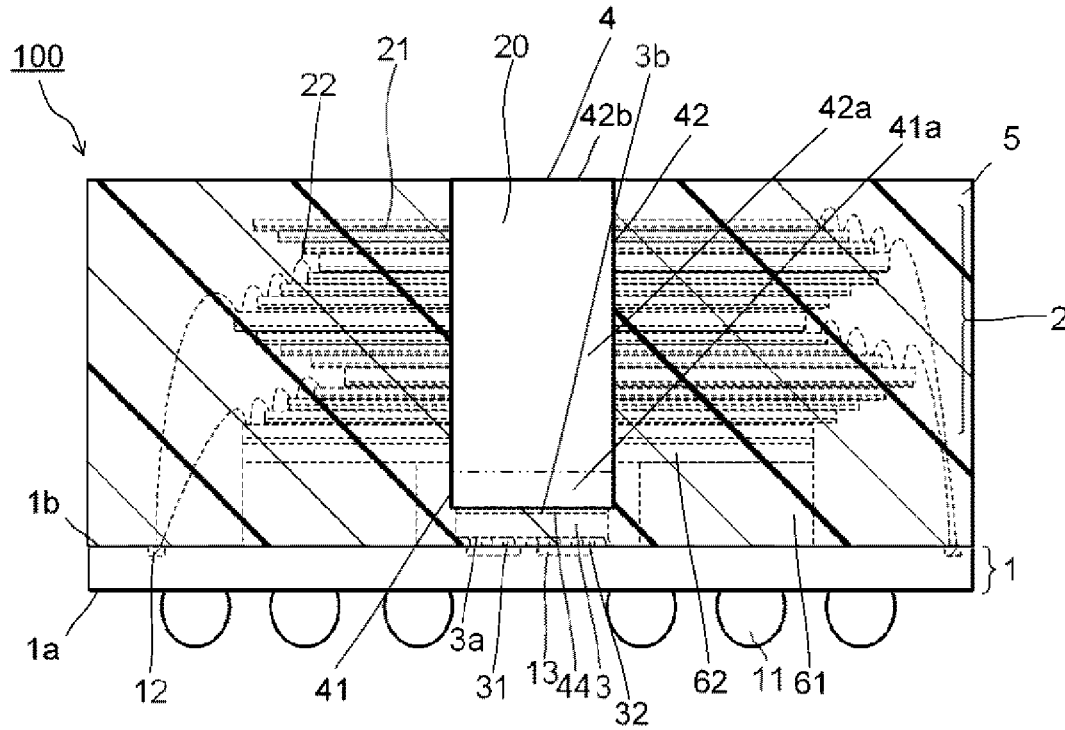
FIG. 6 is a schematic diagram illustrating the second structural example of the semiconductor device.
Figure 7:
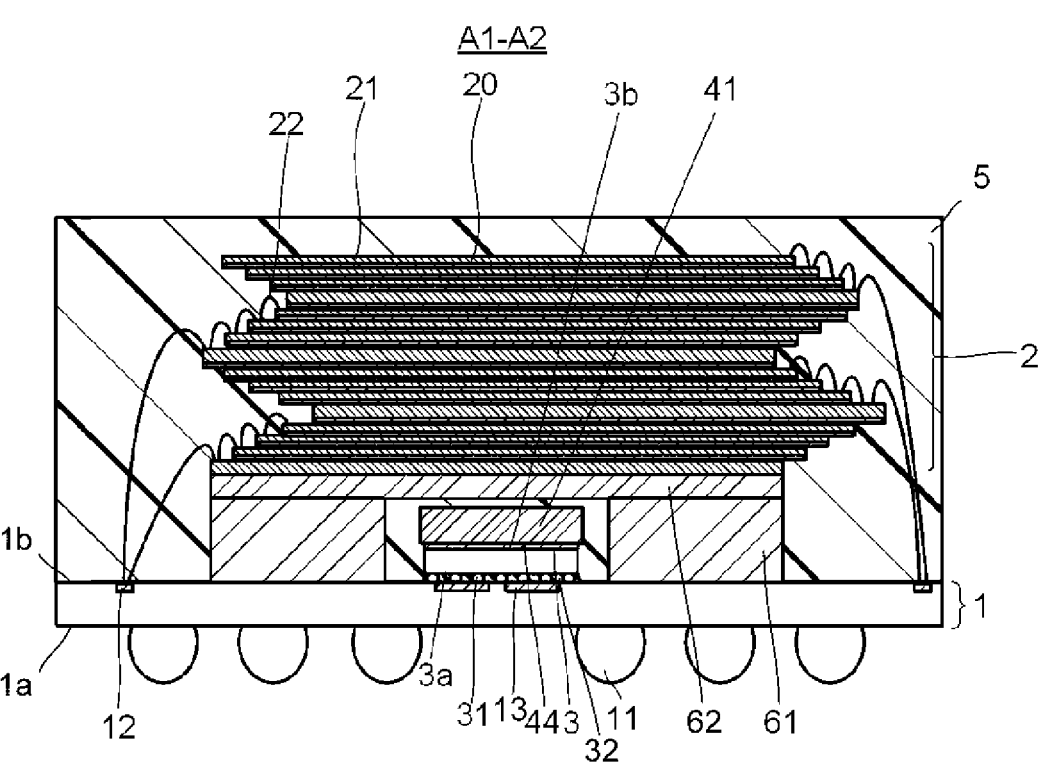
FIG. 7 is a schematic diagram illustrating the second structural example of the semiconductor device.
Figure 8:
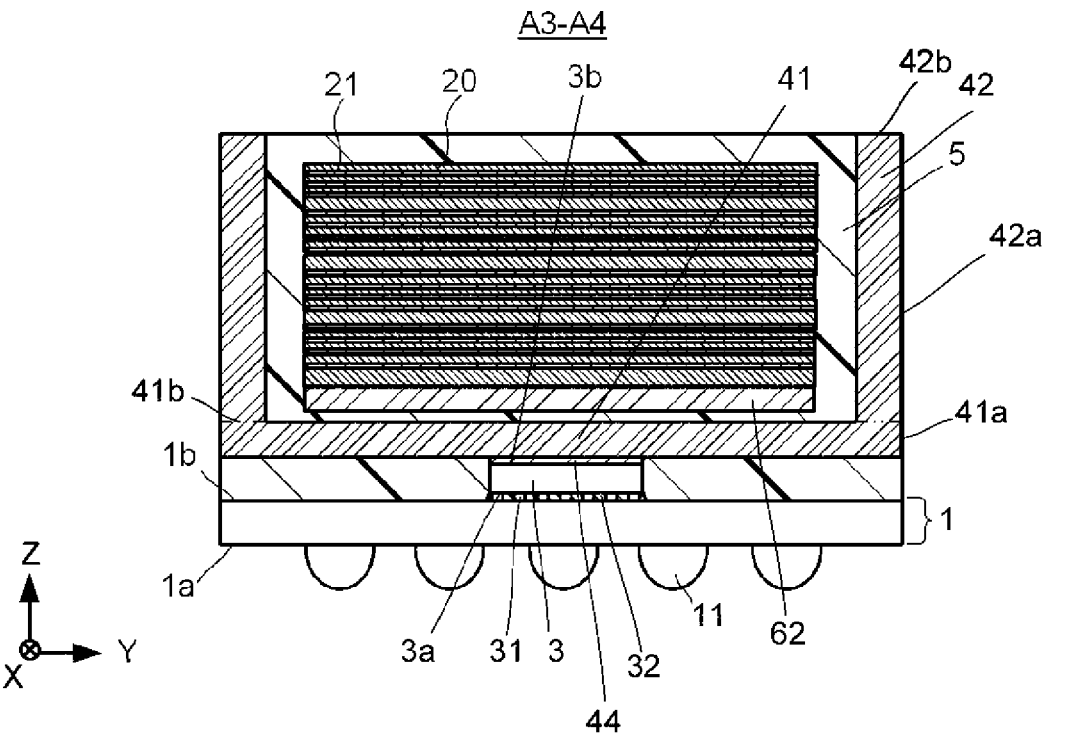
FIG. 8 is a schematic diagram illustrating the second structural example of the semiconductor device.

The structure of the semiconductor device of this embodiment is not limited to the first structural example. FIGS. 5 to 8 are schematic diagrams illustrating a second structural example of the semiconductor device. FIG. 5 illustrates an example of the upper surface of the semiconductor device viewed from the Z-axis direction. FIG. 5 does not illustrate some components, or illustrates the same with dotted lines for convenience. FIG. 6 illustrates an example of the side surface of the semiconductor device viewed from the Y-axis direction. FIG. 7 illustrates an example of the X-Z cross section taken along line segment A1-A2 in FIG. 5. FIG. 8 illustrates an example of a Y-Z cross section taken along line segment A3-A4 in FIG. 5.

The second structural example of the semiconductor device is different from the first structural example in that the same further includes a spacer 61 provided between the wiring board 1 and the chip stacked body 2 and a spacer 62 provided on the spacer 61 and above the semiconductor chip 3, and the chip stacked body 2 is provided on the semiconductor chip 3 upwards, in other words, the semiconductor chip 3 is present between the wiring board 1 and the chip stacked body 2. Here, portions different from the first structural example will be described, and the description of the first structural example may be used as appropriate for other portions.

The spacer 61 and the spacer 62 form a space for mounting the semiconductor chip 3 between the wiring board 1 and the chip stacked body 2. As a result, since the semiconductor chip 3 can be mounted below the chip stacked body 2, the size of the semiconductor device 100 can be reduced.

The spacer 61 is provided between the wiring board 1 and the semiconductor chip 20 located at the lowest stage. The spacer 62 is provided between the semiconductor chip 3 and the semiconductor chip 20 located at the lowest stage. The spacer 61 is bonded to the wiring board 1 with the adhesive layer 21 interposed therebetween. The spacer 61 and the spacer 62 contain, for example, silicon.

FIGS. 5 to 8 illustrate a first chip stacked body including four semiconductor chips 20 stacked on the front surface 1*b* to form steps, a second chip stacked body including four semiconductor chips 20 stacked on the first chip stacked body to form steps, a third chip stacked body including four semiconductor chips 20 stacked on the second chip stacked body to form steps, and a fourth chip stacked body including four semiconductor chips 20 stacked on the third chip stacked body to form steps. In other words, the plurality of semiconductor chips 20 stacked to form steps partially overlap each other. FIGS. 5 to 8 illustrate examples in which the semiconductor chip 20 located at the lowest stage of each of the first to fourth chip stacked bodies is thicker than the semiconductor chips 20 located at the other stages, but the present disclosure is not limited thereto, and for example, all the semiconductor chips 20 may have the same thickness.

As illustrated in the first structural example and the second structural example, the structural example of the semiconductor device of this embodiment includes the heat conductor 4. Accordingly, heat from the semiconductor chip 3 can be easily transferred to the outside of the semiconductor device 100 through the heat conductor 4.

A method of increasing the thickness of the semiconductor chip 3 and exposing the same from the sealing insulator 5 can be considered in order to improve the heat dissipation of the semiconductor device 100. However, if the semiconductor chip 3 is made thicker, the semiconductor chip 3 occupies the central portion of the front surface 1b of the wiring board 1, which causes deterioration in the degree of freedom of layout of the semiconductor chips 20.

Meanwhile, since the semiconductor device of this embodiment has the heat conductor 4 formed therein, deterioration in the degree of freedom of layout of the semiconductor chips 20 can be prevented and the heat dissipation of the semiconductor device 100 can be improved, thereby making it possible to improve reliability of the semiconductor device.

Second Embodiment

This embodiment describes a modification of the heat conductor 4 in the semiconductor device 100 of the first embodiment. Here, portions different from the first embodiment will be described, and the description of the first embodiment may be used as appropriate for other portions.

Figure 9:
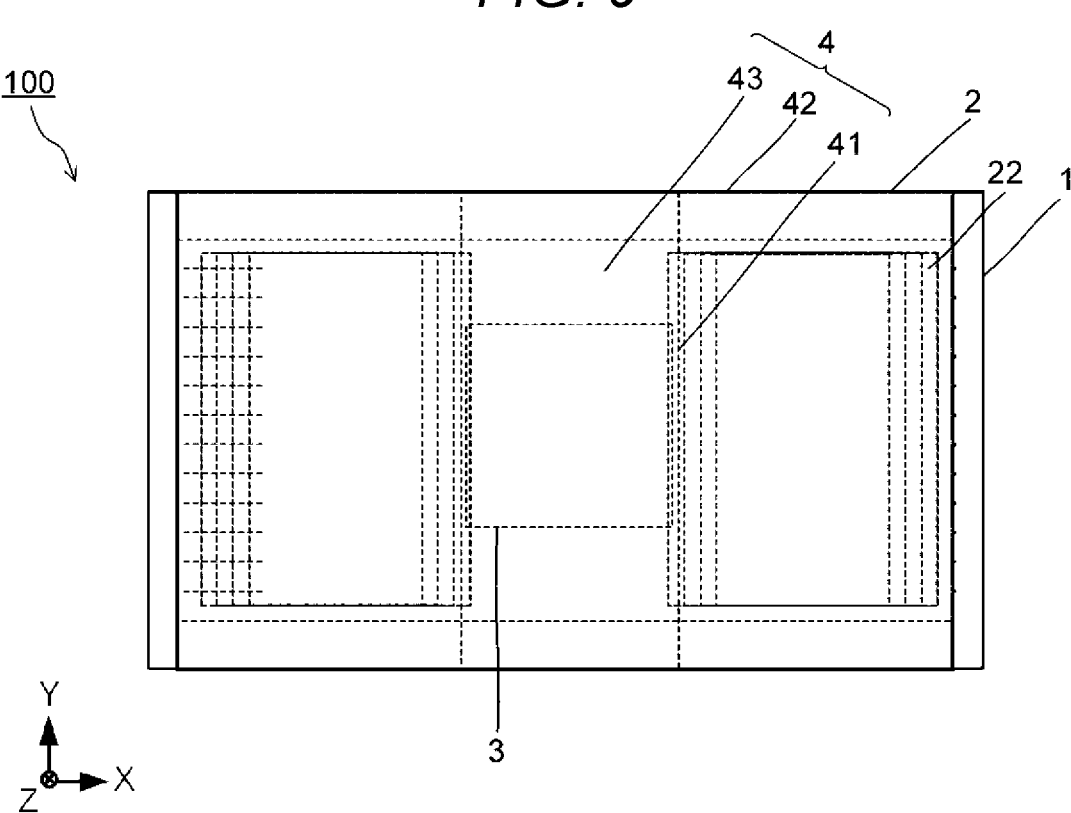
FIG. 9 is a schematic diagram illustrating a modification of the first structural example of the semiconductor device.
Figure 10:
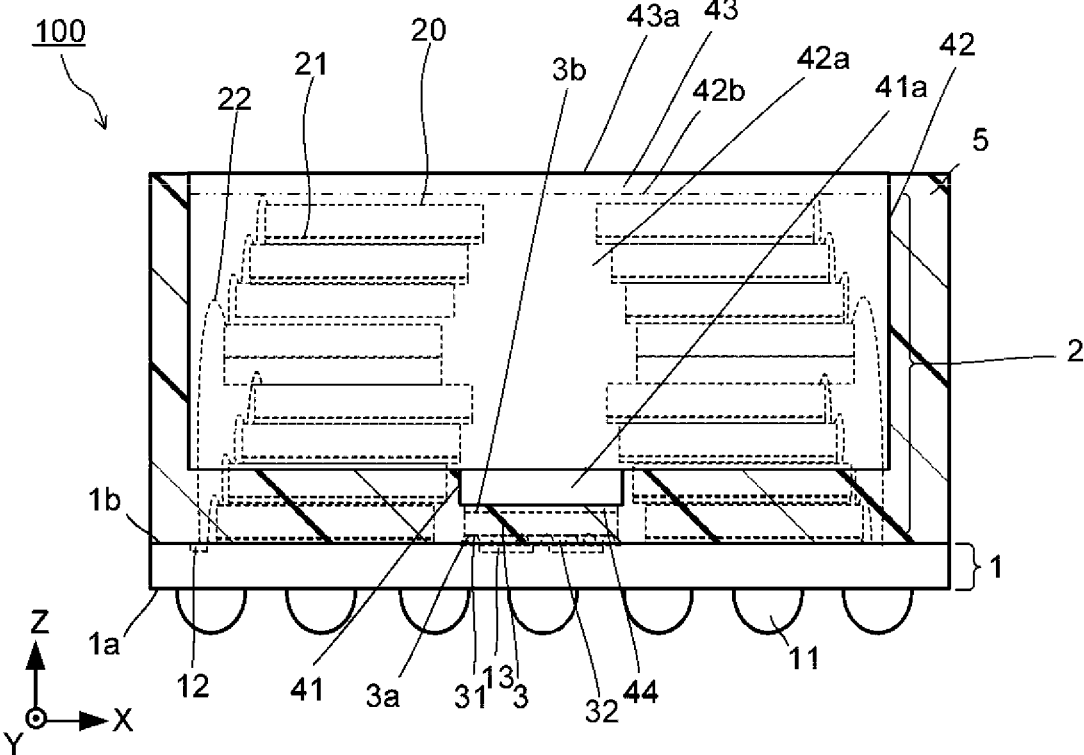
FIG. 10 is a schematic diagram illustrating the modification of the first structural example of the semiconductor device.

FIGS. 9 and 10 are schematic diagrams illustrating a modification of the first structural example of the semiconductor device. FIG. 9 illustrates an example of the upper surface of the semiconductor device viewed from the Z-axis direction. FIG. 9 does not illustrate some components, or illustrates the same with dotted lines for convenience. FIG. 10 illustrates an example of the side surface of the semiconductor device viewed from the Y-axis direction.

Figure 11:
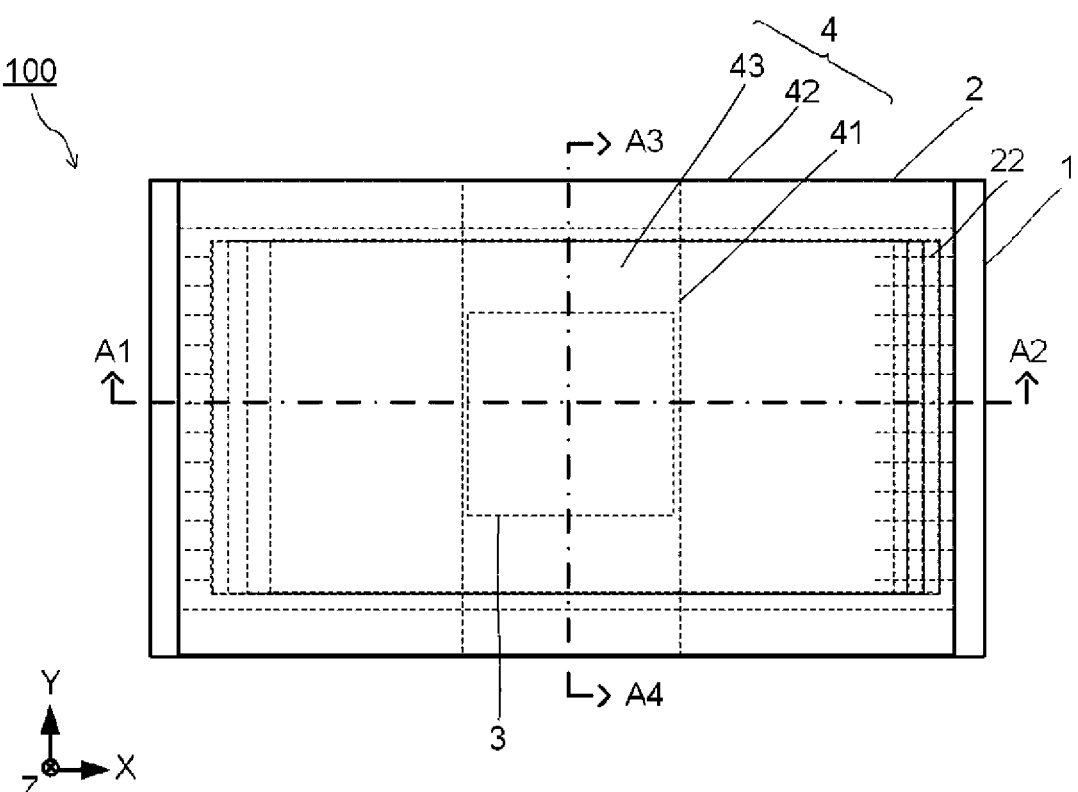
FIG. 11 is a schematic diagram illustrating a modification of the second structural example of the semiconductor device.
Figure 12:
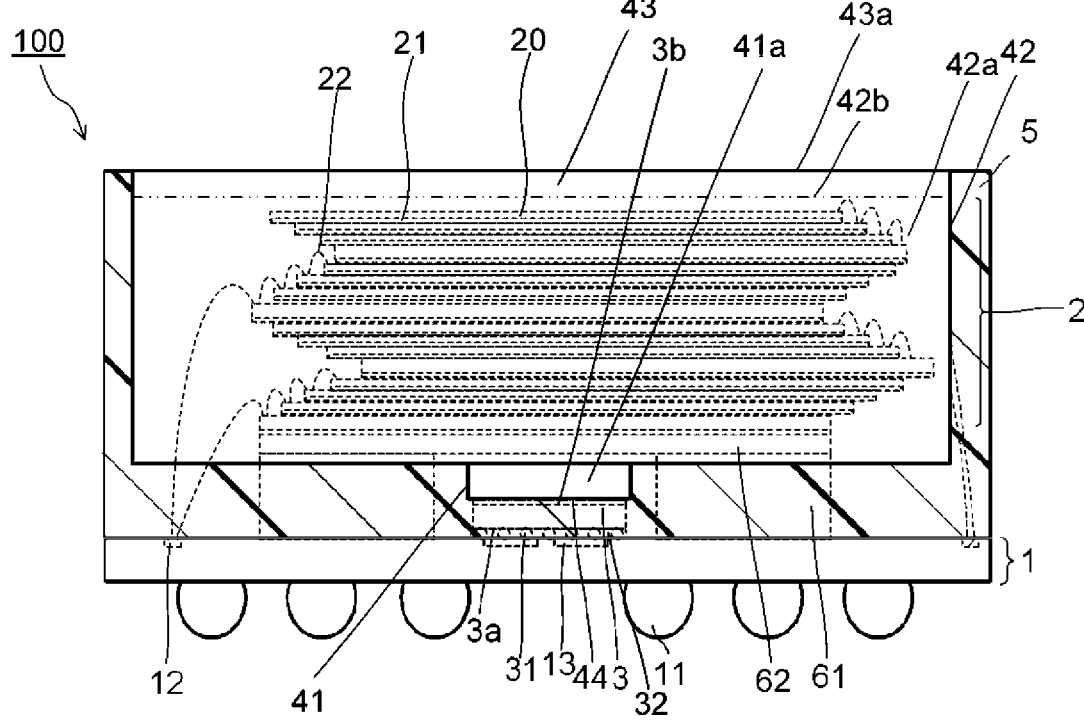
FIG. 12 is a schematic diagram illustrating the modification of the second structural example of the semiconductor device.

FIGS. 11 and 12 are schematic diagrams illustrating a modification of the second structural example of the semiconductor device. FIG. 11 illustrates an example of the upper surface of the semiconductor device viewed from the Z-axis direction. FIG. 11 does not illustrate some components, or illustrates the same with dotted lines for convenience. FIG. 12 illustrates an example of the side surface of the semiconductor device viewed from the Y-axis direction.

The lower plate 41 is provided between the sealing insulator 5 and the front surface 3b and is in contact with the adhesive layer 44. The side plate 42 is exposed from the sealing insulator 5, and extends in the X-axis direction and the Z-axis direction so as to overlap the chip stacked body 2 when viewed from the Y-axis direction. The upper plate 43 (third region) is formed on the end surface 42b of the side plate 42 in the Z-axis direction, and extends in the X-axis direction and the Y-axis direction so as to overlap the chip stacked body 2 when viewed from the Z-axis direction. An end surface 43a of the upper plate 43 facing the Z-axis direction is exposed from the sealing insulator 5. The end surface 42b of the side plate 42 in the Y-axis direction and the side surface of the sealing insulator 5 may be flush with each other. The end surface 43a of the upper plate 43 in the Z-axis direction and the upper surface of the sealing insulator 5 may be flush with each other. FIGS. 10 and 12 illustrate an interface between the region of the side plate 42 and the region of the upper plate 43 with a two-dot chain line.

Each of the area of the side plate 42 in the XZ direction and the area of the upper plate 43 in the XY direction is larger than the area of the end surface 41a of the lower plate 41 in the Y-axis direction. The areas of the side plate 42 and the upper plate 43 are increased in this manner, thereby making it possible to improve the heat dissipation of the semiconductor device 100.

The heat conductor 4 may be formed in such a manner that a first member including the lower plate 41 and the side plate 42 are prepared, the member is boned to the upper surface of the semiconductor chip 3 with the adhesive layer 44 interposed therebetween, the chip stacked body 2 is formed, and then a second member including the upper plate 43 is bonded to the first member. However, the present disclosure is not limited thereto. For example, the heat conductor 4 may be formed in such a manner that a first member including the lower plate 41 is prepared, the member is bonded to the upper surface of the semiconductor chip 3 with the adhesive layer 44 interposed therebetween, the chip stacked body 2 is formed, and then a second member including the side plate 42 and the upper plate 43 is bonded to the first member. Therefore, an adhesive layer may be interposed between the lower plate 41 and the side plate 42. An adhesive layer may be interposed between the side plate 42 and the upper plate 43.

It is noted that this embodiment may be appropriately combined with other embodiments.

Third Embodiment

This embodiment will describe an example in which a heat insulating material is formed on the side surface of the semiconductor chip 3 in the semiconductor device 100 of the first embodiment. Here, portions different from the first embodiment will be described, and the description of the first embodiment may be used as appropriate for other portions.

Figures 13, 14:
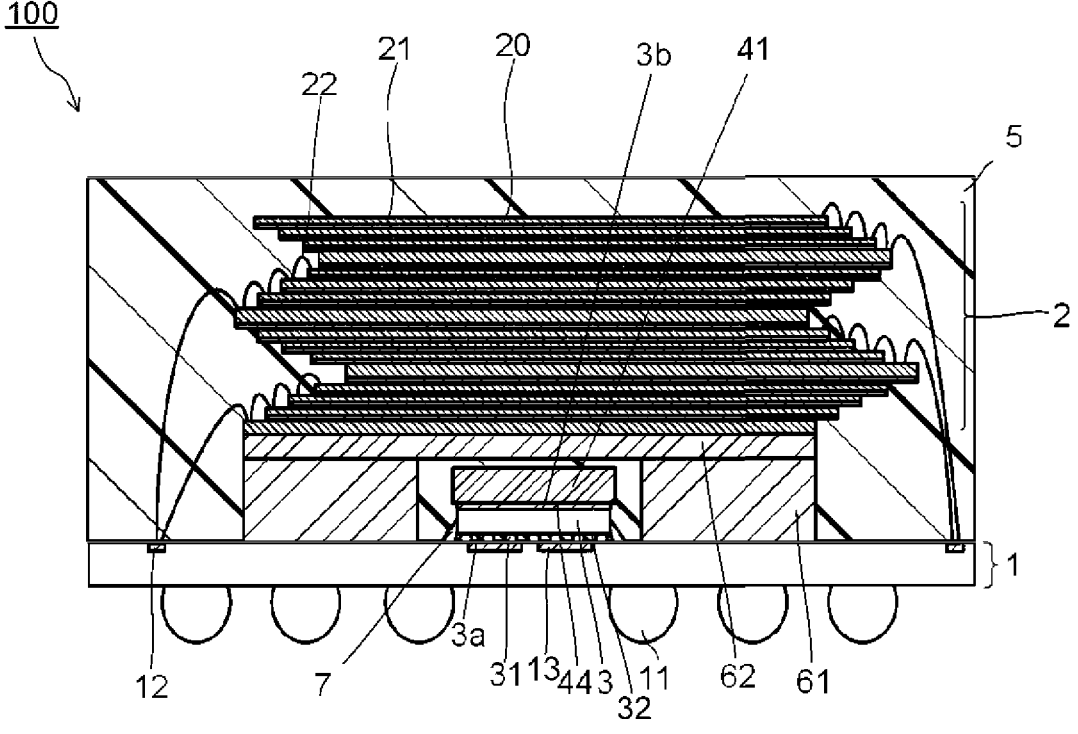
FIG. 13 is a schematic diagram illustrating another modification of the first structural example of the semiconductor device.
FIG. 14 is a schematic diagram illustrating another modification of the second structural example of the semiconductor device.

FIGS. 13 and 14 are schematic diagrams illustrating different modifications of the first structural example and the second structural example of the semiconductor device, respectively. FIGS. 13 and 14 illustrate an example of the X-Z cross section.

The semiconductor device 100 of a third embodiment is different from the semiconductor device 100 of the first embodiment in that a heat insulating material 7 is further provided.

The heat insulating material 7 is provided around the underfill resin 32 and covers the side surface of the semiconductor chip 3. A material of the heat insulating material 7 is an epoxy-based thermosetting resin. Heat conductivity of the heat insulating material 7 is lower than heat conductivity of a resin contained in the sealing insulator 5. The heat conductivity of the heat insulating material 7 at room temperature is, for example, less than 1 W/m·K.

In this embodiment, the heat insulating material 7 is formed, thereby making it possible to prevent the heat from the semiconductor chip 3 from moving in the lateral direction of the semiconductor chip 3. Therefore, heat dissipation efficiency of the semiconductor device 100 can be improved.

It is noted that this embodiment may be appropriately combined with other embodiments.

Fourth Embodiment

In this embodiment, a modification of the second structural example of the semiconductor device 100 will be described. Here, portions different from the first embodiment will be described, and the description of the first embodiment may be used as appropriate for other portions.

Figure 15:
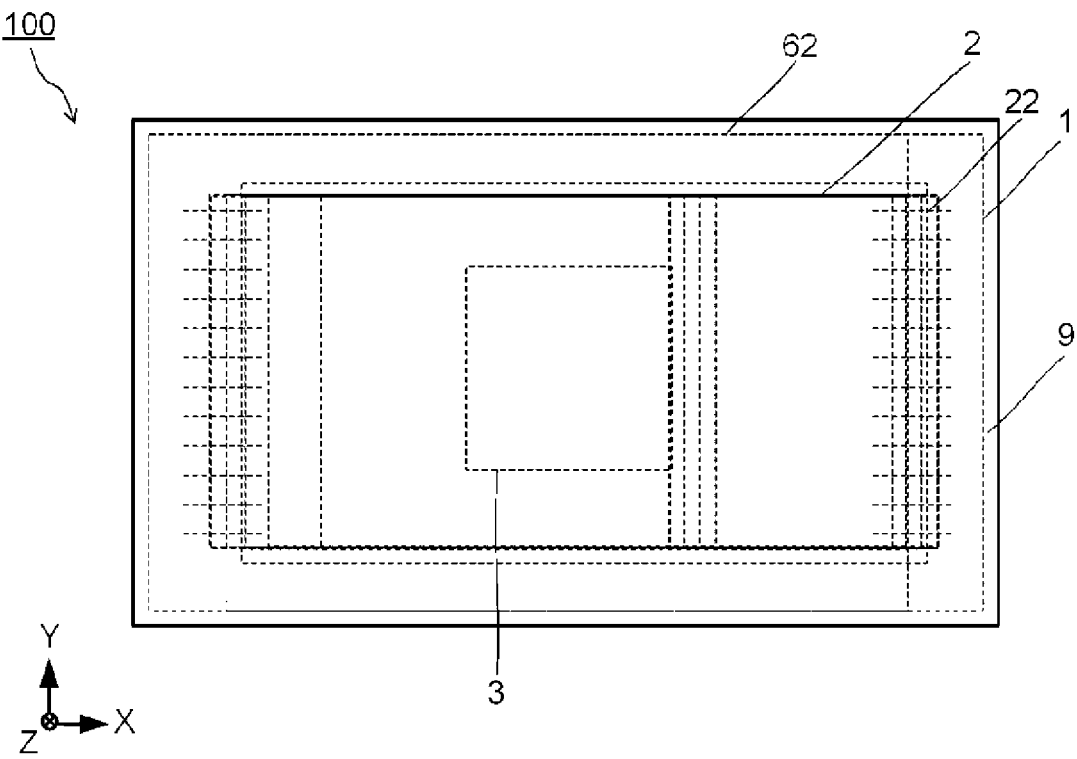
FIG. 15 is a schematic diagram illustrating another modification of the second structural example of the semiconductor device.
Figure 16:
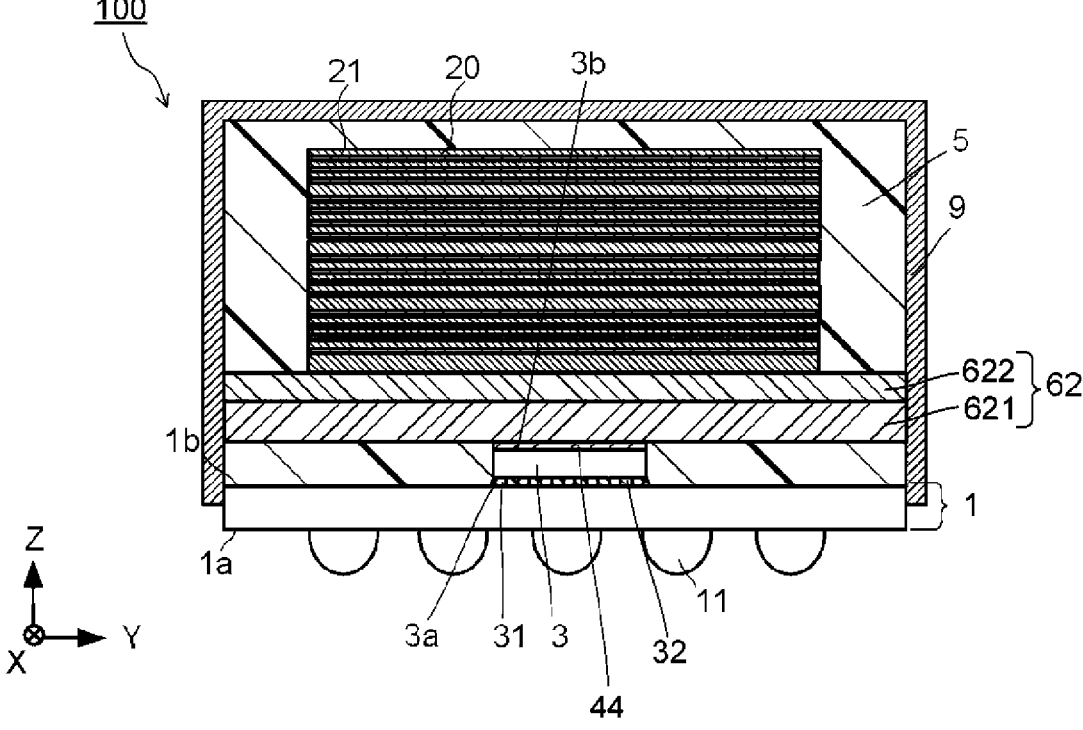
FIG. 16 is a schematic diagram illustrating another modification of the second structural example of the semiconductor device.

FIGS. 15 and 16 are schematic diagrams illustrating another modification of the second structural example of the semiconductor device. FIG. 15 illustrates an example of the upper surface of the semiconductor device viewed from the Z-axis direction. FIG. 16 illustrates an example of the Y-Z cross section.

The semiconductor device 100 illustrated in FIGS. 15 and 16 is different from the second structural example of the semiconductor device 100 of the first embodiment in that the structure of the spacer 62 is different and a heat conductor 9 is provided instead of the heat conductor 4.

The heat conductor 9 covers the sealing insulator 5. The heat conductor 9 functions as a conductive shield. The heat conductor 9 has heat conductivity higher than heat conductivity of a resin contained in the sealing insulator 5. The heat conductor 9 is formed using a material such as copper, nickel, or SUS. A part of the heat conductor 9 may be in contact with the wiring board 1 or may be connected to a ground wiring of the wiring board 1. The heat conductor 9 may cover the side surface and the upper surface of the sealing insulator 5.

The spacer 62 includes a heat conductor 621 and a heat insulating material 622. The heat conductor 621 and the heat insulating material 622 extend in the Y-axis direction, are exposed from the sealing insulator 5 to contact the heat conductor 9.

Heat conductivity of the heat conductor 621 is higher than the heat conductivity of the resin contained in the sealing insulator 5. The heat conductor 621 is formed using, for example, silicon. The heat conductor 621 may have members corresponding to the side plate 42 and the upper plate 43 of the heat conductor 4. The heat insulating material 622 may have members corresponding to the side plate 42 and the upper plate 43 of the heat conductor 4.

The heat insulating material 622 is provided between the heat conductor 621 and the chip stacked body 2. It is preferable that heat conductivity of the heat insulating material 622 is lower than the heat conductivity of the resin contained in the sealing insulator 5. The heat conductivity of the heat insulating material 622 is, for example, less than 1 W/m·K. The heat insulating material 622 is formed using, for example, polyimide. The heat insulating material 622 can prevent transfer of heat from the semiconductor chip 3 to the semiconductor chip 20. Accordingly, heat dissipation efficiency of the semiconductor device 100 can be improved.

As described above, in the semiconductor device of this embodiment, the heat conductor 621 and the heat conductor 9 are formed instead of the heat conductor 4, thereby making it possible to easily transfer heat from the semiconductor chip 3 to the outside of the semiconductor device 100 through the heat conductor 621 and the heat conductor 9. As a result, since heat dissipation of the semiconductor device 100 can be improved, reliability of the semiconductor device can be improved.

It is noted that this embodiment may be appropriately combined with other embodiments.

Fifth Embodiment

In this embodiment, a method of manufacturing the semiconductor device will be described. Here, although the first structural example of the semiconductor device is described as an example, the second structural example of the semiconductor device may also be manufactured by the same steps.

FIG. 17 is a flowchart showing an example of the method of manufacturing the semiconductor device. The flowchart shown in FIG. 17 includes a formation step S1 of the semiconductor chip 3, a formation step S2 of the heat conductor 4, a formation step S3 of the chip stacked body 2, a formation step S4 of the sealing insulator 5, a formation step S5 of the external connection terminal 11, a grinding step S6, and a singulation step S7.

FIG. 18 is a schematic diagram illustrating the formation step S1 of the semiconductor chip 3. FIG. 18 is an example of the X-Z cross section. In the formation step S1 of the semiconductor chip 3, as illustrated in FIG. 18, the semiconductor chip 3 is formed upwardly on the front surface 1*b* of the wiring board 1, and the connection terminal 31 and the wiring board 1 are electrically connected to each other. The semiconductor chip 3 is formed in such a manner that the adhesive layer 44 is formed on the front surface 3*b*, the connection terminal 31 is mounted on the conductive pad 13 on the front surface 1*b* so as to contact the same, and then the underfill resin 32 seals a space between the front surface 3*a* and the front surface 1*b*.

Figures 19, 20:
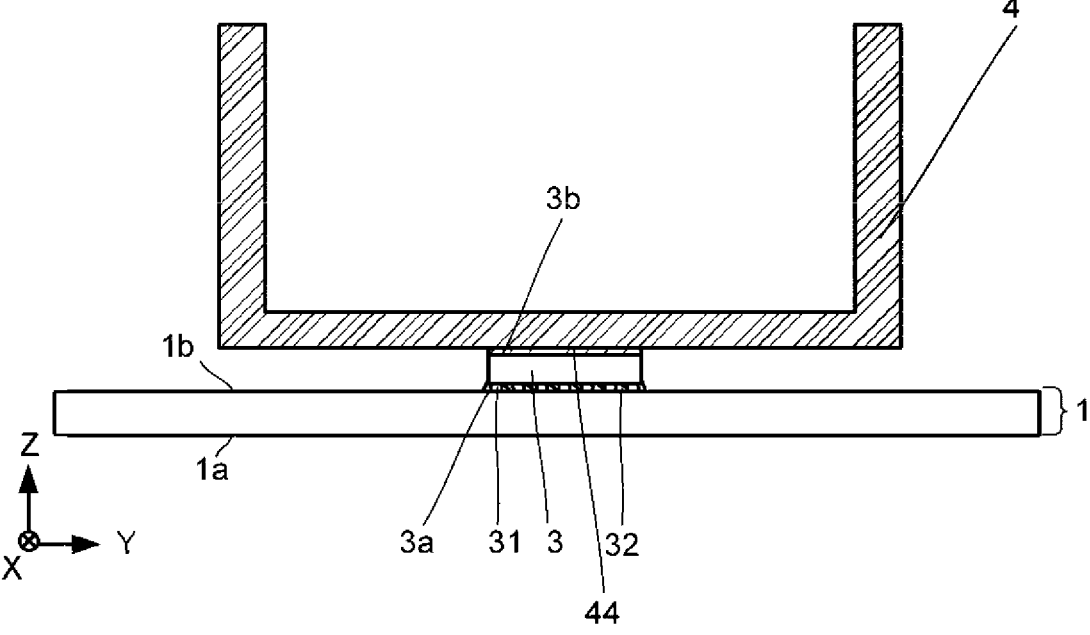
FIG. 19 is a schematic diagram illustrating a formation step S2 of a heat conductor.
FIG. 20 is a schematic diagram illustrating the formation step S2 of the heat conductor.

FIGS. 19 and 20 are schematic diagrams illustrating the formation step S2 of the heat conductor 4. FIG. 19 is an example of the X-Z cross section. FIG. 20 is an example of the Y-Z cross section. In the formation step S2 of the heat conductor 4, as illustrated in FIGS. 19 and 20, the heat conductor 4 and the front surface 3*b* are bonded to each other with the adhesive layer 44 interposed therebetween, thereby forming the heat conductor 4 above the wiring board 1 with the semiconductor chip 3 interposed therebetween.

Figure 21:
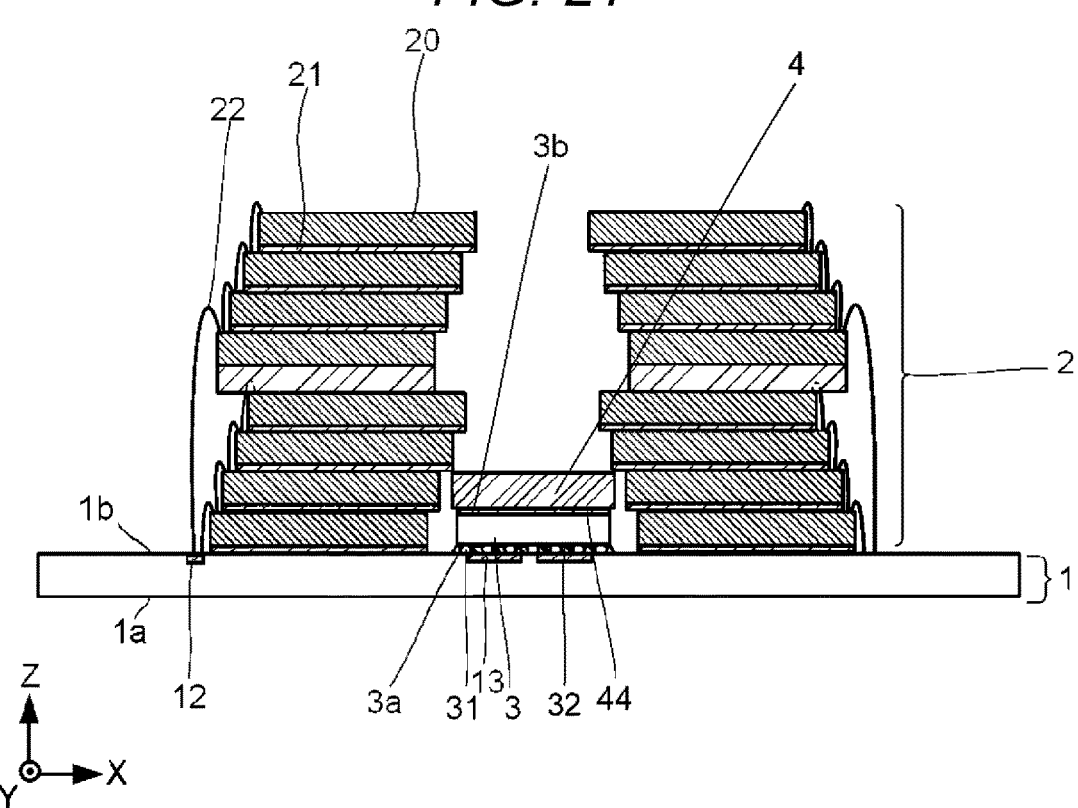
FIG. 21 is a schematic diagram illustrating a formation step S3 of a chip stacked body.

FIG. 21 is a schematic diagram illustrating the formation step S3 of the chip stacked body 2. FIG. 21 is an example of the X-Z cross section. As illustrated in FIG. 21, in the formation step S3 of the chip stacked body 2, the chip stacked body 2 is formed by stacking the semiconductor chips 20 on the front surface 1*b* upwards with the adhesive layer 21 interposed therebetween and forming the bonding wire 22.

Figure 22:
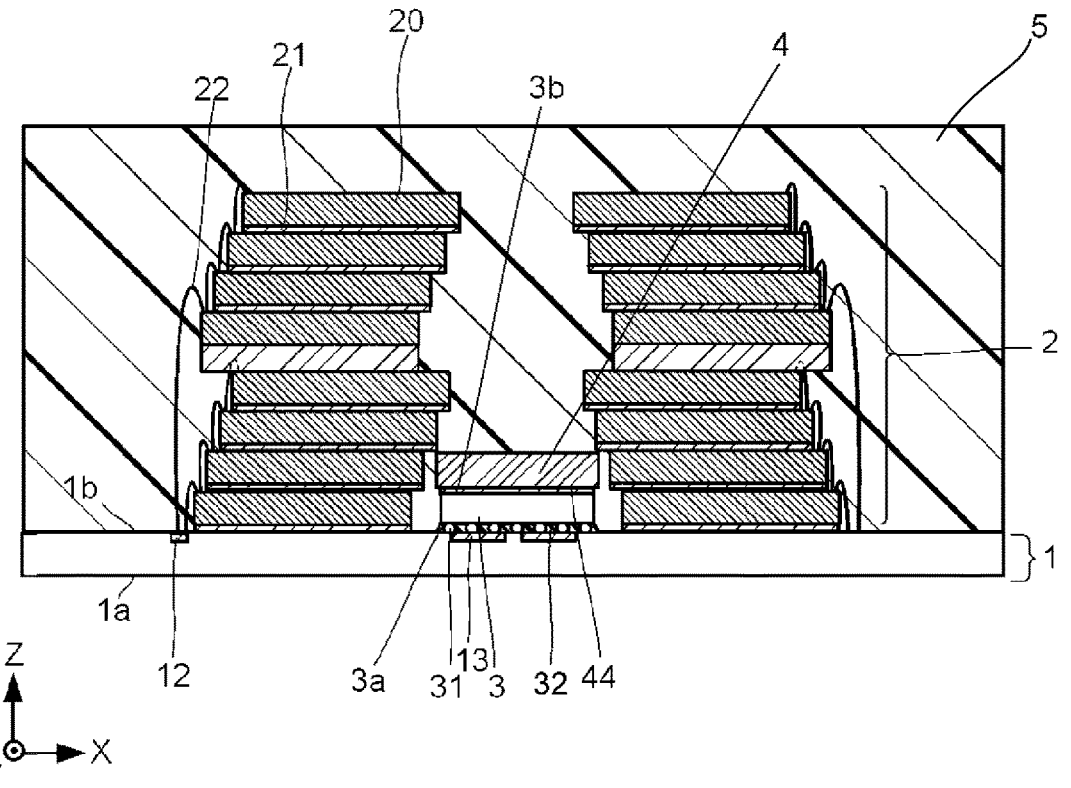
FIG. 22 is a schematic diagram illustrating a formation step S4 of a sealing insulator.
Figures 23, 24:
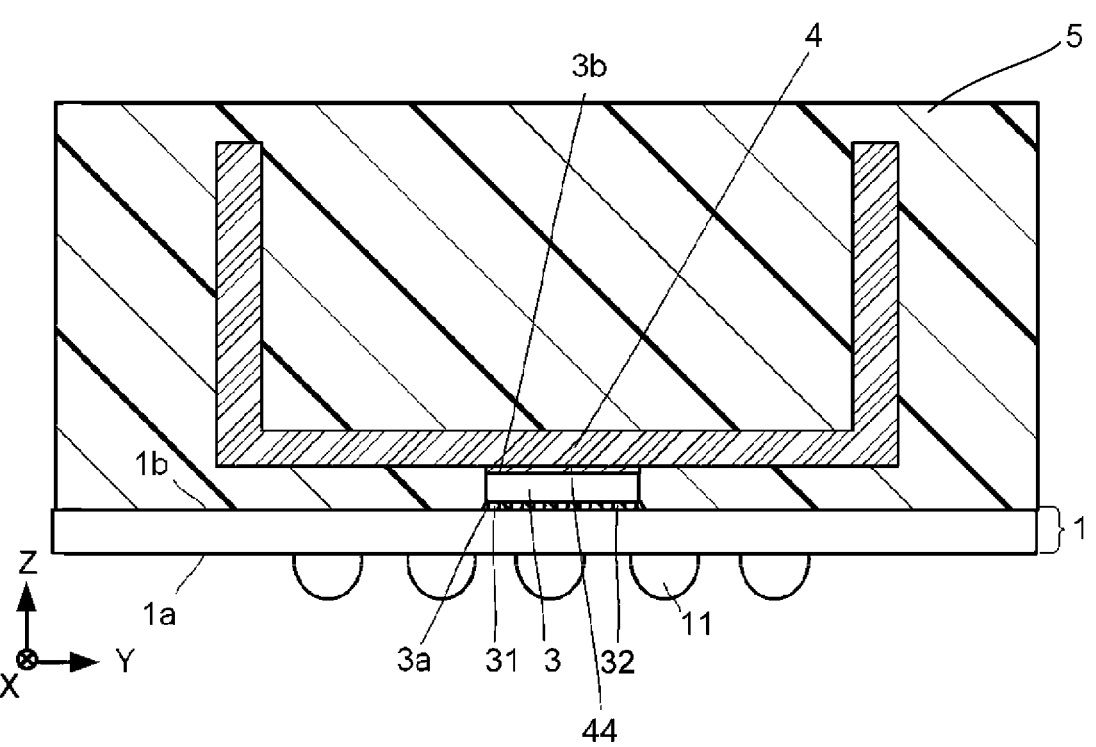
FIG. 23 is a schematic diagram illustrating the formation step S4 of the sealing insulator.
FIG. 24 is a schematic diagram illustrating a formation step S5 of an external connection terminal.

FIGS. 22 and 23 are schematic diagrams illustrating the formation step S4 of the sealing insulator 5. FIG. 22 is an example of the X-Z cross section. FIG. 23 is an example of the Y-Z cross section. In the formation step S4 of the sealing insulator 5, the sealing insulator covers the chip stacked body 2, the semiconductor chip 3, and the heat conductor 4, as illustrated in FIGS. 22 and 23.

FIG. 24 is a schematic diagram illustrating a formation step S5 of the external connection terminal 11. FIG. 24 is an example of the Y-Z cross section. In the formation step S5 of the external connection terminal 11, the external connection terminal 11 is formed on the front surface 1*a*, as illustrated in FIG. 24.

Figure 25:
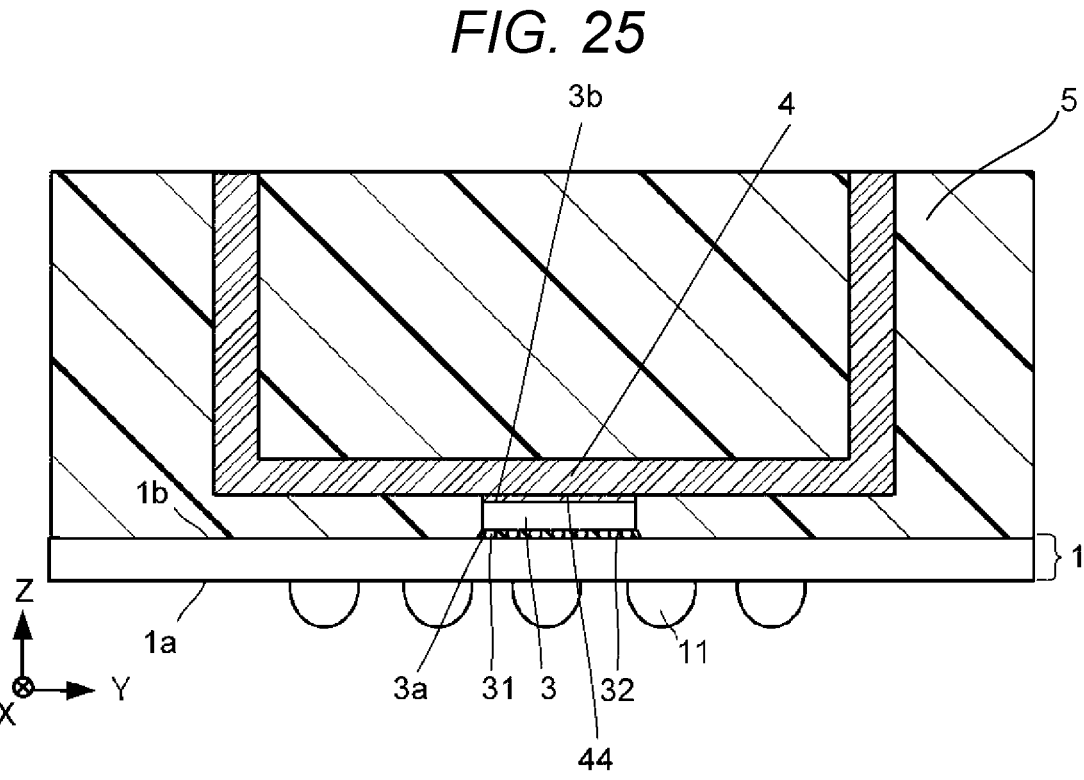
FIG. 25 is a schematic diagram illustrating a grinding step S6.

FIG. 25 is a schematic diagram illustrating the grinding step S6. FIG. 25 is an example of the Y-Z cross section. In the grinding step S6, as illustrated in FIG. 25, a part of the heat conductor 4 is exposed by partially grinding the sealing insulator 5 in the thickness direction (Z-axis direction). The sealing insulator 5 can be ground by, for example, chemical mechanical polishing (CMP).

Figure 26:
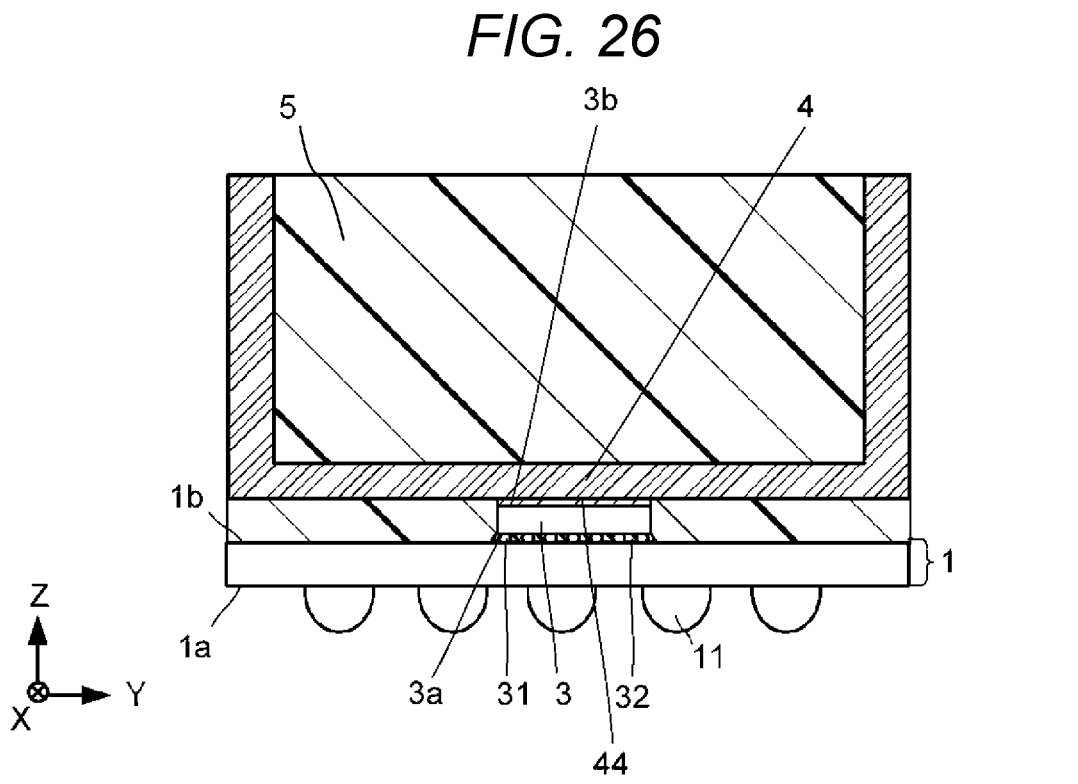
FIG. 26 is a schematic diagram illustrating a singulation step S7.

FIG. 26 is a schematic diagram illustrating the singulation step S7. In the singulation step S7, as illustrated in FIG. 26, by dicing the wiring board 1 for each semiconductor device 100, the semiconductor device 100 is divided into individual pieces, and another part of the heat conductor 4 is exposed.

For example, the side plate 42 can be exposed by cutting the heat conductor 4 in the thickness direction.

The semiconductor device 100 may be formed through the above-described steps.

It is noted that this embodiment may be appropriately combined with other embodiments.

Sixth Embodiment

In this embodiment, a modification of the method of manufacturing the semiconductor device according to the fifth embodiment will be described. Here, although the first structural example of the semiconductor device is described as an example, the second structural example of the semiconductor device may also be manufactured by the same steps.

Figure 27:
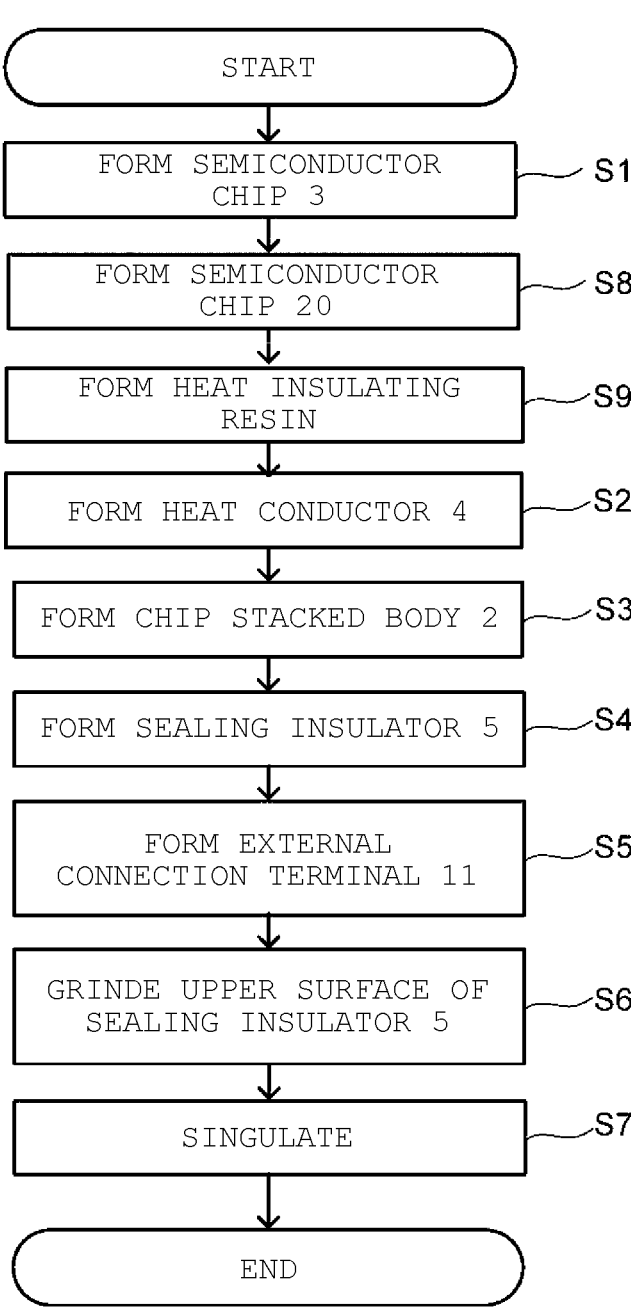
FIG. 27 is a flowchart showing a modification of the method of manufacturing the semiconductor device.

FIG. 27 is a flowchart showing a modification of the method of manufacturing the semiconductor device. The flowchart shown in FIG. 27 is different from the flowchart shown in FIG. 17 in that a formation step S8 of the semiconductor chip 20 and a formation step S9 of the heat insulating material 7 are further provided between the formation step S1 of the semiconductor chip 3 and the formation step S3 of the chip stacked body 2. Here, portions different from the fifth embodiment will be described, and the description of the fifth embodiment may be used as appropriate for other portions.

Figures 28, 29:
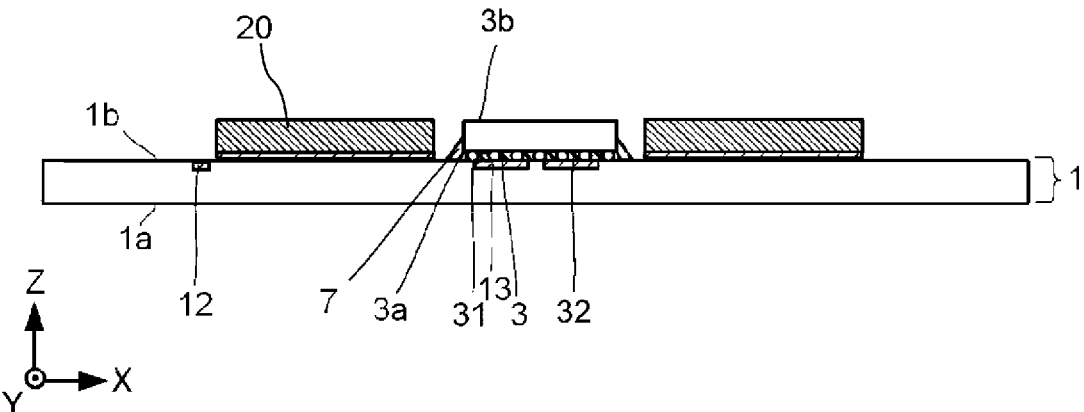
FIG. 28 is a schematic diagram illustrating a formation step S8 of a semiconductor chip.
FIG. 29 is a schematic diagram illustrating a formation step S9 of a heat insulating material.

FIG. 28 is a schematic diagram illustrating the formation step S8 of the semiconductor chip 20. FIG. 28 is an example of the X-Z cross section. In the formation step S8 of the semiconductor chip 20, as illustrated in FIG. 28, only the semiconductor chip 20 located at the lowest stage is formed upwardly on the front surface 1b.

FIG. 29 is a schematic diagram illustrating the formation step S9 of the heat insulating material 7. FIG. 29 is an example of the X-Z cross section. In the formation step S9 of the heat insulating material 7, the heat insulating material 7 configured to cover at least a part of the side surface of the semiconductor chip 3 is formed.

In this embodiment, by forming the semiconductor chip 20 located at the lowest stage before forming the heat insulating material 7, the semiconductor chip 20 located at the lowest stage functions as a partition wall, thereby making it possible to prevent a resin used to form the heat insulating material 7 from flowing and spreading.

It is noted that this embodiment may be appropriately combined with other embodiments.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:

a wiring board;

a first semiconductor chip disposed on the wiring board extending upwards, the first semiconductor chip including a first front surface and a second front surface, the first front surface having a connection terminal electrically connected to the wiring board, and the second front surface opposite the first front surface, the first front surface is a bottom surface of the first semiconductor chip and the second front surface is a top surface of the first semiconductor chip;

a chip stacked body disposed on the wiring board extending upwards, the chip stacked body including a second semiconductor chip;

a sealing insulator configured to cover the first semiconductor chip and the chip stacked body, the sealing insulator containing a resin; and a heat conductor disposed between the sealing insulator and the second front surface, the heat conductor including a first region extending in a first direction and in contact with the first front surface, the first direction being in an in-plane direction of the wiring board, the heat conductor including a second region extending in a second direction from an end of the first region on a side of the first direction, wherein a direction perpendicular to the in-plane direction of the wiring board and the first direction is defined as the second direction, the heat conductor having a heat conductivity higher than a heat conductivity of the resin.

2. The semiconductor device according to claim 1, wherein (i) a first end surface of the first region facing the side of the first direction, and (ii) a second end surface of the second region facing the side of the first direction, are exposed from the sealing insulator.

3. The semiconductor device according to claim 1, wherein the heat conductor further includes a third region provided at an end of the second region on a side of the second direction, and the third region is different from the second region.

4. The semiconductor device according to claim 3, wherein a third end surface of the third region facing the side of the second direction is exposed from the sealing insulator.

5. The semiconductor device according to claim 1, wherein the chip stacked body is disposed on the first semiconductor chip extending upwards, and wherein the heat conductor is spaced apart from the chip stacked body.

6. The semiconductor device according to claim 1, wherein the heat conductor has (i) an oxide front surface in contact with the sealing insulator or (ii) an uneven front surface in contact with the sealing insulator.

7. The semiconductor device according to claim 1, further comprising a first heat insulating material disposed on a side surface of the first semiconductor chip, the first heat insulating material having a heat conductivity lower than the heat conductivity of the resin.

8. The semiconductor device according to claim 5, further comprising a second heat insulating material disposed between the heat conductor and the chip stacked body, the second heat insulating material having a heat conductivity lower than the heat conductivity of the resin.

9. The semiconductor device according to claim 1, wherein the wiring board includes a printed wiring board.

10. The semiconductor device according to claim 1, wherein the first semiconductor chip includes a memory controller chip.

11. The semiconductor device according to claim 10, wherein the second semiconductor chip includes a memory chip.

12. The semiconductor device according to claim 1, wherein the heat conductor includes a metal material.

13. The semiconductor device according to claim 1, wherein the first region includes a lower plate.

14. The semiconductor device according to claim 13, wherein the second region includes a side plate.

15. The semiconductor device according to claim 14 wherein the lower plate overlaps the side plate.

16. The semiconductor device according to claim 1, further comprising an underfill resin disposed between the first semiconductor chip and the wiring board.

17. A semiconductor device comprising:

a wiring board;

a first semiconductor chip disposed on the wiring board extending upwards, the first semiconductor chip including a first front surface and a second front surface, the first front surface having a connection terminal electrically connected to the wiring board, and the second front surface opposite the first front surface;

a chip stacked body disposed on the wiring board extending upwards, the chip stacked body including a second semiconductor chip;

a sealing insulator configured to cover the first semiconductor chip and the chip stacked body, the sealing insulator containing a resin; and a heat conductor disposed between the sealing insulator and the second front surface, the heat conductor including a first region extending in a first direction, the first direction being in an in-plane direction of the wiring board, the heat conductor including a second region extending in a second direction from an end of the first region on a side of the first direction, the heat conductor including a third region provided at an end of the second region on a side of the second direction, wherein a direction perpendicular to the in-plane direction of the wiring board and the first direction is defined as the second direction, the heat conductor having a heat conductivity higher than a heat conductivity of the resin, a third end surface of the third region facing the side of the second direction is exposed from the sealing insulator.

*  *  *  *  *